(12) United States Patent  (10) Patent No.: US 8,580,049 B2
Zimmer et al.  (45) Date of Patent: Nov. 12, 2013

(54) MODIFICATION OF SURFACES TO INCREASE THE SURFACE TENSION

(75) Inventors: Volker Zimmer, Dossenheim (DE); Hans-Peter Braun, Weinheim (DE)

(73) Assignee: Roche Diagnostics GmbH, Mannheim (DE)

( * ) Notice: Subject to any disclaimer, the term of this patent is extended or adjusted under 35 U.S.C. 154(b) by 0 days.

(21) Appl. No.: 13/487,656

(22) Filed: Jun. 4, 2012

(65) Prior Publication Data

US 2012/0237399 A1 Sep. 20, 2012

Related U.S. Application Data

(62) Division of application No. 11/374,332, filed on Mar. 13, 2006, now Pat. No. 8,211,245, which is a division of application No. 09/555,618, filed as application No. PCT/EP98/07851 on Dec. 3, 1998, now Pat. No. 7,025,836.

(30) Foreign Application Priority Data

Dec. 4, 1997 (DE) .................................. 197 53 848

(51) Int. Cl.
*C23C 22/56* (2006.01)
(52) U.S. Cl.
USPC .......................................... 148/275; 148/277
(58) Field of Classification Search
USPC .................... 148/275, 277; 422/68.1
See application file for complete search history.

(56) References Cited

U.S. PATENT DOCUMENTS

| 3,255,035 | A | 6/1966 | Clough et al. |
| 3,730,783 | A | 5/1973 | Streel |
| 3,926,564 | A | 12/1975 | Giaever |
| 4,139,660 | A | 2/1979 | Tur |
| 4,722,906 | A | 2/1988 | Guire |
| 4,759,805 | A | 7/1988 | Saruwatari et al. |
| 4,761,381 | A | 8/1988 | Blatt et al. |
| 4,973,493 | A | 11/1990 | Guire |
| 4,979,959 | A | 12/1990 | Guire |
| 5,002,582 | A | 3/1991 | Guire et al. |
| 5,414,075 | A | 5/1995 | Swan et al. |

(Continued)

FOREIGN PATENT DOCUMENTS

| EP | A 0 045 416 | 2/1982 |
| GB | A 895879 | 5/1962 |
| GB | A 1084696 | 9/1967 |
| GB | A 2075556 | 11/1981 |

OTHER PUBLICATIONS

The Making, Shaping and Treating of Steel, Edited by Harold e. McGannon United States Steel, eighth edition, 1964, pp. 312-318.
AN 115:237352, Protective oxide coating on aluminum and magnesium alloys, Res. Discl. (1991) 330, 798.

(Continued)

*Primary Examiner* — Jie Yang
(74) *Attorney, Agent, or Firm* — Bose McKinney & Evans LLP

(57) ABSTRACT

The invention concerns an analytical test element in which the sample liquid is transported from a sample application site to a determination site, where a detection site lies upstream of the sample application site in the transport direction. The analytical test element has at least one surface which is composed of at least one element that can be oxidized with water or an alloy that can be oxidized with water which has been treated by the action of boiling water or water vapor.

14 Claims, 1 Drawing Sheet

(56) References Cited

U.S. PATENT DOCUMENTS

| | | | |
|---|---|---|---|
| 5,798,031 A * | 8/1998 | Charlton et al. | 204/403.14 |
| 6,696,024 B1 * | 2/2004 | Leichner et al. | 422/503 |
| 7,008,799 B1 * | 3/2006 | Zimmer et al. | 436/514 |
| 7,238,534 B1 * | 7/2007 | Zimmer | 436/169 |
| 7,799,578 B2 * | 9/2010 | Zimmer | 436/174 |

OTHER PUBLICATIONS

Ikawa et al., Comparison of a new Microcrystalline Aluminum Oxide Hydroxide and Amorphous Aluminum Hydroxide for Binding to Phosphate, Proteins, Neucleotides, Lipids and Carbohydrates, Chem. Pharm. Bull 41 (6) 1055-1059 (1993).

* cited by examiner

MODIFICATION OF SURFACES TO INCREASE THE SURFACE TENSION

RELATED APPLICATIONS

This is a divisional of U.S. application Ser. No. 11/374,332, filed Mar. 13, 2006 now U.S. Pat. No. 8,211,245, which is a divisional of U.S. application Ser. No. 09/555,618, filed Jan. 5, 2001 now U.S. Pat. No. 7,025,836 and claims priority to PCT/EP98/07851 filed Dec. 3, 1998 and German Patent Application No. 197 53 848.7, filed Dec. 4, 1997, which is each hereby incorporated by reference in its entirety.

TECHNICAL FIELD

The invention concerns a process for the production of surface coatings as well as the use of a surface coating to increase the surface tension of objects.

SUMMARY

The coating of surfaces of solid objects is a widely used means of specifically changing the surface properties of objects. Here reference is only made to the countless methods of corrosion protection for every-day objects made of base metals or the painting of objects with the aim of changing their optical appearance.

Coating is usually understood as a manufacturing process for applying a firmly adhering layer of a shapeless material to a work piece or a supporting sheet. One can in principle distinguish between four groups of coating processes which each differ by the state of the coating material before coating:
1. Coating from a gaseous or vaporous state such as evaporation coating or metallizing;
2. Coating from a liquid, pulpy or paste-like state such as painting, dispersion or hot-melt coating;
3. Coating from an ionized state by electrolytic or chemical depositing such as among others the eloxal process or electrophoretic painting.
4. Coating from a solid i.e. granular or powder state such as powder coating or coating by sintering.

Plastics have turned out to be the production material of choice for fields of application in which cheap single-use articles are used especially in medical diagnostics or environmental analysis. Since plastics and in particular cheap, easy-to-process commodity plastics that can be almost shaped at will, are usually composed of non-polar organic polymers, most of them cannot be wetted or only poorly wetted by polar media such as water and aqueous liquids, in particular biological samples. This property is utilized for certain applications especially where adherence of the liquid to the plastic object is not desired such as for disposable pipette tips. On the other hand there are numerous fields of applications for plastic objects in which a wettability with polar liquids is desired such as for example in the field of rapid diagnostics in which plastics can serve as materials for taking up biological sample liquids.

There is therefore no lack of different processes which have the aim of hydrophilically modifying plastic surfaces. Hydrophilic surfaces are characterized by a high surface tension which have a value near to the value of the surface tension of water (72 mN/m). Examples of a hydrophilic modification of plastic surfaces are corona plasma treatment, plasma chemical vapour deposition (PACVD, e.g. Antec Co. Kelkheim), the covalent binding of hydrophilic polymers with a photoreactive capability onto a plastic surface described for example in U.S. Pat. No. 4,973,493 (Photo Link Surface, BSI Corporation Co., Eden Prairie, Minn., U.S.A.), the application of layers containing wetting agents onto a plastic surface (for example Adhesive Research Co., Glen Rock, Pa., U.S.A.) or coating of inorganic-organic nanocomposites by means of sol-gel technology on the surfaces to be modified (for example INM, Co. Saarbrucken).

The processes mentioned above which each have advantages and disadvantages have been able to establish themselves for the hydrophilic modification of plastic surfaces whether of foils or formed pieces.

The corona plasma treatment leads to an increase in the surface tension which continuously decreases after the treatment over a short period of several days up to a few weeks. Moreover the surface tensions that can be achieved are relatively low.

Slightly higher surface tensions than those of the corona plasma treatment can be achieved with the PACVD technology. Although this method leads to surface coatings that are more stable over time, a decrease of the surface tension with time is still observed in this case.

Surfaces which are furnished with so-called photo link surfaces or which have been coated with layers containing wetting agents have a surface tension which is stable over time. However, both variants do not lead to optimally high surface tensions. An additional fundamental disadvantage of coating with layers containing wetting agents is that the wetting agents accumulate in a liquid aqueous sample that is contacted with the layer and can thus change it or make it unusable.

Coating of inorganic-organic nanocomposites by means of sol-gel technology on the surfaces to be modified leads to increased surface tensions. However, a disadvantage is that the process itself is very complicated and time-consuming which is why it does not appear to be suitable for modifying mass-produced plastic articles.

The object of the present invention was to eliminate the disadvantages of the prior art. In particular it was intended to provide surface coatings with a high surface tension that are stable over time to be used for example for the hydrophilic modification of objects. Moreover it should be possible to carry out the coating in a simple and reliable manner in order to be suitable for the modification of mass-produced articles.

The object is achieved by the subject matter of the invention as characterized in the patent claims.

The invention concerns a process for the production of a surface coating to increase the surface tension of objects characterized in that a layer of at least one element that can be oxidized with water or an alloy that can be oxidized with water is deposited on an object and this is at least superficially oxidized by the subsequent action of boiling water or water vapour on the deposited layer.

The invention additionally concerns the use of a surface coating to increase the surface tension of objects characterized in that the surface coating is obtained by deposition of a layer of at least one element that can be oxidized with water or an alloy that can be oxidized with water and subsequent action of boiling water or water vapour on the deposited layer.

Boiling water or water vapour and particularly preferably deionized water is preferably used to treat the deposited surface coating.

BRIEF DESCRIPTION OF THE DRAWINGS

The above-mentioned aspects of exemplary embodiments will become more apparent and will be better understood by reference to the following description of the embodiments taken in conjunction with the accompanying drawings, wherein.

DETAILED DESCRIPTION

Figure 1:
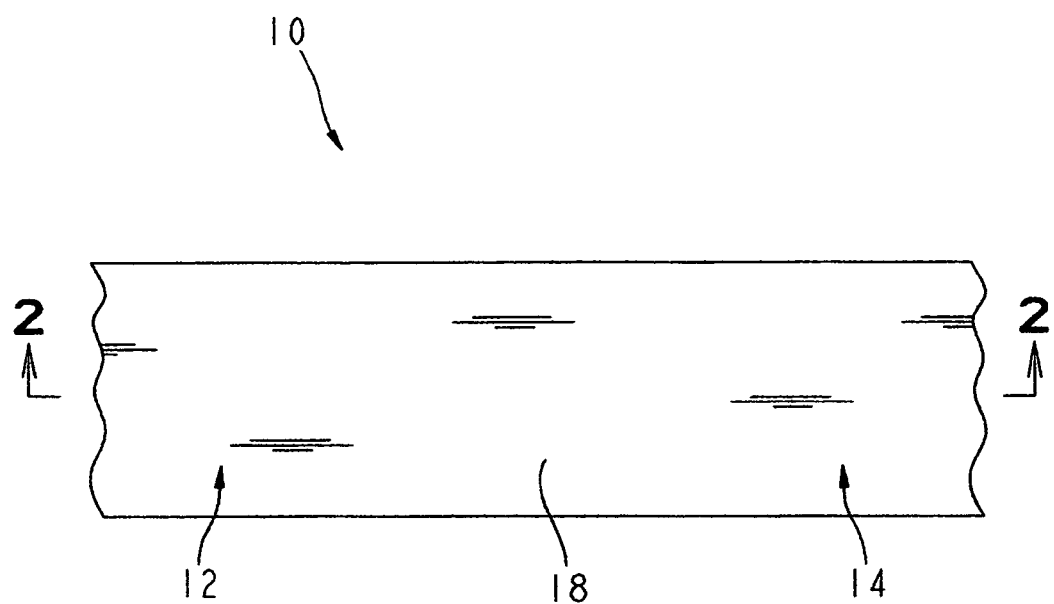
FIG. 1 is a top view of a portion of an analytical test element.
Figure 2:
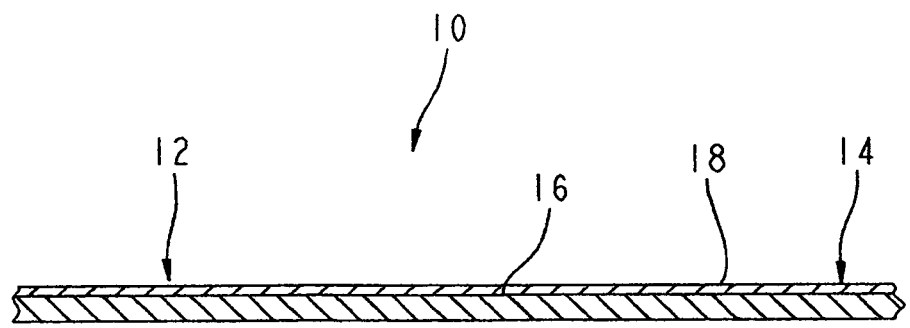
FIG. 2 is a view taken along lines 2-2 of FIG. 1.

The embodiments of the present invention described below are not intended to be exhaustive or to limit the invention to the precise forms disclosed in the following detailed description. Rather, the embodiments are chosen and described so that others skilled in the art may appreciate and understand the principles and practices of the present invention.

The increase in the surface tension results from an increase in the polarity and corresponds to an increased hydrophilicity of the observed surfaces. The hydrophilicity is the water affinity of a surface. In this connection hydrophilic surfaces are water-attracting surfaces. Aqueous samples also including biological samples like blood, urine, saliva, sweat and samples derived therefrom such as plasma and serum spread well on such surfaces. Such surfaces are characterized among others in that a boundary surface of a water drop forms an acute rim or contact angle on them (cf. for example the statements under the entry "Benetzung" in the "CD Römpp Chemie Lexikon" version 1.0, 1995). In contrast an obtuse rim angle is formed at the interface between a water drop and a surface on hydrophobic i.e. water repellent surfaces.

The rim angle which is a result of the surface tensions of the test liquid and of the surface to be examined is a measure of the hydrophilicity of a surface. Water for example has a surface tension of 72 mN/m. If the value of the surface tension of the observed surface is much below this value i.e. more than 20 mN/m, then the wetting is poor and the resulting rim angle is obtuse. Such a surface is referred to as hydrophobic. If the surface tension approximates the value which is found for water then the wetting is good and the rim angle is acute. If, in contrast, the surface tension is the same as or higher than that of the value found for water, then the drop runs and there is a total spreading of the liquid. It is then no longer possible to measure a rim angle. Surfaces which form an acute rim angle with water drops or on which a total spreading of a water drop is observed are referred to as hydrophilic.

According to the invention the surface coating should be carried out by depositing a layer of at least one element that can be oxidized with water or an alloy that can be oxidized with water on an object. All objects come into consideration as objects to be coated whose surface in the uncoated state has a lower hydrophilicity than in the coated state after treatment. Examples are plastic, metal, glass, ceramics, paper, fleece, cardboard etc. where the objects can have any shape e.g. flat, three-dimensional or porous.

All 4 coating processes mentioned above can in principle be used to deposit the layer i.e. coating from a gaseous or vaporous state, from a liquid, pulp or paste-like state, from an ionized state or from a solid state. The coating is preferably carried out from a gaseous state. A layer of an element or an alloy that can be oxidized with water is particularly preferably applied to the surface to be modified in a vacuum coater. This process is for example used cost-effectively for large surfaces for the packaging industry and electrical industry for example with aluminum as the element that can be oxidized with water.

The layers can be applied to the object to be coated as a continuous layer covering the whole area but also in the form of any two-dimensional patterns.

It is essential for the subject matter of the invention that the deposited layer of the element that can be oxidized with water or alloy that can be oxidized with water is subsequently treated by the action of boiling water or water vapour after the actual coating process. In this case it is sufficient to allow boiling water or water vapour to act at normal pressure. However, it is preferably to use superheated water vapour since this considerably reduces the exposure times. For example a 30 nm thick aluminum layer can be completely oxidized through with superheated water vapour within ca. 45 s.

In this treatment the deposited layer of the element that can be oxidized with water or the alloy that can be oxidized with water is at least superficially oxidized. In this process at least the surface of the deposited layer of the element that can be oxidized with water or the alloy that can be oxidized with water loses its elemental properties. In the case of metals or alloys thereof this means among others the loss of lustre and conductivity. In this process the oxidation of the surface goes beyond the layer that may be present as a natural protective layer. Thin metallic layers are oxidized during treatment with boiling water or water vapour to such an extent that they completely lose their metallic appearance and may become completely transparent.

The treatment with boiling water or water vapour is preferably carried out with pure water and preferably with deionized water (for example aqua purificata according to DAB). The surfaces obtained in this process are not contaminated with chemicals which are found in other oxidation processes in particular wet chemical oxidation processes such as oxidation with oxidizing acids. Purification and rinsing steps can therefore be omitted and make the process more simple and cost-effective.

According to the invention it is possible to use base elements for the coating which can be oxidized by boiling water or water vapour. The elements Al, Si, Ti, V, Cr, Mn, Fe, Co, Ni, Zn, Ga, Ge, Zr, Nb, Cd, In, Sn, Sb are preferred. Al, Si, Ti, Zr are particularly preferred. Al is quite especially preferred.

Base alloys that can be oxidized by boiling water or water vapour can also be used according to the invention. These are preferably alloys which contain at least two components from the following group of elements comprising Al, Si, Ti, V, Cr, Mn, Fe, Co, Ni, Zn, Ga, Ge, Zr, Nb, Cd, In, Sn and Sb. An alloy of 99% by weight Al and 1% by weight Si is for example suitable.

Alloys are also suitable which contain at least one component from the following first group of elements comprising Al, Si, Ti, V, Cr, Mn, Fe, Co, Ni, Zn, Ga, Ge, Zr, Nb, Cd, In, Sn and Sb which are alloyed with at least one element from the following second group of elements comprising Mg, Ca, Sr and Ba such as for example an alloy of 95% by weight Al and 5% by weight Mg. Alloys are particularly preferred which contain at least one component from the following first group of elements comprising Al, Si, Ti and Zr which are alloyed with at least one element of the following second group of elements comprising Mg, Ca, Sr and Ba. Alloys that are composed of aluminum which is alloyed with at least one element from the following group of elements comprising Mg, Ca, Sr and Ba are quite especially preferred.

The deposited coat according to the invention preferably has a thickness of 1 nm to 500 nm. The action of boiling water or water vapour on the deposited layer leads to the formation of oxide layers which are preferably between 0.1 nm and 500 nm, particularly preferably between 10 nm and 100 nm thick.

The surface coatings produced according to the invention are homogeneous inorganic oxide layers which have a high surface tension and high polarity, which are stable over a long period and have a good adherence with concomitant elasticity on the coated object.

The characterization of surfaces with high surface tensions (high-energy surfaces) causes certain technical measurement problems. In various measuring methods such as contact angle measurement the interfacial effects of the surface to be examined relative to test liquids are used. Since it is hardly possible to produce test liquids with surface tensions that are considerably above the value for water (72 mN/m), there are certain limits to being able to extrapolate above this value. Kinetic effects also add to the problems. A liquid which wets a surface, spreads over a short period typically less than 1.5 s. However, spontaneous wetting is important for the determination of the surface tension with regard to capillary activity. In dynamic contact angle methods one refers to the progressive angle of wetting of a drop that is becoming continuously larger. However, the dosing of the drop and measurement of the drop with commercially available automated contact angle measuring instruments is too slow for the hydrophilic surface coatings presented here to be able to unequivocally describe the surface coatings according to the invention. It therefore turned out to be practical to measure the surface coating according to the invention by comparative determination of the filling time of a test capillary.

The cylindrical test capillary is composed of two parallel opposing foils which are kept at a defined distance from one another by an exactly defined spacer in the form of a double-sided adhesive tape which determines the length, width and height dimensions of the capillary. The opposing surfaces of the two foils are provided with the coating to be tested. The dimensions of the capillary are 0.1 mm height, 2 mm width and 15 mm length where the length of the capillary corresponds to the available transport path of the liquid and the height of the capillary is that dimension which causes the capillarity. The capillary has an opening that serves to take up the test liquid with a cross-sectional area of 0.1 mm.times.2 mm which corresponds to the base area of the cylindrical capillary. A vent opening is provided at the opposite end of the capillary which allows the displaced air in the capillary to escape when the test liquid is sucked in. The test liquid is preferably distilled water or aqua purificata according to DAB but it is also possible to use other test liquids depending on the field of application of the surface coating such as blood or other body fluids. The filling times for the test liquids are measured at half (7.5 mm transport path) and complete filling (15 mm transport path). Comparative results are described in example 1.

The surface coatings 18 are particularly preferably used according to the invention in analytical test elements 10 to increase the hydrophilicity. The invention therefore also concerns an analytical test element or a test strip in which the sample liquid is transported from a sample application site 12 to a determination site 14 in which a detection site lies downstream of the sample application site in the transport direction. In this connection it is important that the analytical test element 10 has at least one surface 16 which is composed of at least one element that can be oxidized with water or an alloy that can be oxidized with water which has been treated by the action of boiling water or water vapour. The materials described above come into consideration as elements and alloys.

Surfaces that have been made hydrophilic are especially essential for capillary gap test elements. Capillary gap test elements are test elements in which the sample liquid is moved in a transport channel (capillary channel, capillary gap) from a sample application site to a distant sample detection site with the aid of capillary forces in order to undergo a detection reaction at this site.

The ability of a capillary to suck up a liquid depends on the wettability of the channel surface with the liquid. This means for aqueous samples that a capillary should be manufactured from a material whose surface tension almost reaches 72 mN/m or exceeds this value.

Sufficiently hydrophilic materials for the construction of a capillary which rapidly sucks up aqueous samples are for example glass, metal or ceramics. However, these materials are unsuitable for use in test carriers since they have some disadvantages such as risk of breaking in the case of glass or ceramics. Therefore plastic foils or moulded parts are usually used to manufacture test elements. As a rule the plastics used hardly exceed a surface tension of 45 mN/m. Even with the, in a relative sense, most hydrophilic plastics such as polymethylmethacrylate (PMMA) or polyamide (PA) it is only possible—if at all—to construct slowly sucking capillaries. Capillaries made of hydrophobic plastics such as for example polystyrene (PS), polypropylene (PP) or polyethylene (PE) essentially do not suck aqueous samples. Consequently it is necessary to endow the plastics used as a construction material for test elements with capillary active channels with hydrophilic properties i.e. to hydrophilize them.

Therefore in analytical test elements with capillary gaps at least one, but preferably two and especially preferably two opposing surfaces which form the inner surface of the channel capable of capillary liquid transport are preferably hydrophilized. If more than one surface is hydrophilized then the surfaces can either be made hydrophilic using the same or different methods. Hydrophilization is particularly necessary when the materials that form the capillary active channel are themselves hydrophobic or only very slightly hydrophilic because they are for example composed of nonpolar plastics. Nonpolar plastics such as for example polystyrene (PS), polyethylene (PE), polyethylene terephthalate (PET) or polyvinyl chloride (PVC) are advantageous as carrier materials because they do not absorb the liquids to be examined and thus the sample volume can be effectively utilized by the detection reaction. The hydrophilization of the surface of the capillary channel enables a polar, preferably aqueous, sample liquid to readily enter the capillary channel and be rapidly transported there to the site of the test element where the detection takes place.

The hydrophilization is quite especially preferably achieved by using thin layers of oxidized aluminum. These layers are either applied directly to the desired components of the test element for example by vacuum coating the work pieces with metallic aluminum and subsequently oxidizing the metal, or by using metal foils or metal-coated plastics for the construction of the test carriers which also have to be oxidized to achieve the desired hydrophilicity. In this case metal layer thicknesses of 1 to 500 nm are adequate. The metal layer is subsequently oxidized to form the oxidized form whereby according to the invention oxidation in the presence of water vapour or by boiling in water have proven to be especially suitable methods. The oxide layers formed in this manner are between 0.1 and 500 nm, preferably between 10 and 100 nm thick depending on the method. Larger layer thicknesses of the metal layer as well as of the oxide layer can in principle be realized in practice but do not exhibit any additional advantageous effects.

Further applications according to the invention of surface coatings are:
- making polymer foils, fabrics, fleeces or three-dimensional formed pieces hydrophilic and detergent-free to improve their adhesive properties for paint, adhesive or plastic coats,
- adsorptive binding of polar molecules or materials in particular for the adsorption of biologically active molecules such as proteins, enzymes, antibodies, nucleic acids (cf for example Chem. Pharm. Bull. 41, (1993) 1055 since the increased surface tension is associated with an increase in the polarity of the surface,
- production of surface patterns such as cross-pieces for the transport of polar liquids, for a defined boundary between polar and nonpolar areas in which case these patterns can be produced by the structure of the deposited material itself or subsequently by selectively covering certain areas of the deposited material layer with for example wax when it is treated with boiling water or water vapour.

The invention is elucidated by the following example.

Example 1

Comparison of the Filling Times of a Test Capillary

A cylindrical test capillary was constructed from two parallel opposing foils which are kept at a defined distance from one another by an exactly defined spacer in the form of a double-sided adhesive tape which determines the length, width and height dimensions of the capillary. The opposing surfaces of the two foils were provided with the coating to be tested. The foils that were used were polyester foils (ME-LINEX®, ICI) which were variously modified as follows.

1.) Foil which was coated with photoreactively equipped hydrophilic polymers (BSI)
2.) Foil which was subjected to a corona plasma treatment (Antec)
3.) Foil on which a layer containing a wetting agent was applied (A.R.)
4.) Foil on which inorganic-organic nanocomposites were coated by means of sol-gel technology (INM)
5.) Foil on which aluminum oxide was vapour deposited but which was not subsequently treated with boiling water or water vapour (Alu-Ox).
6.) Foil on which firstly a layer of aluminum of 30 nm thickness was vapour deposited which was subsequently completely oxidized for 45 s with water vapour (Alu-Ox/$H_2O$).

The dimensions of the capillary are 0.1 mm height, 2 mm width and 15 mm length where the length corresponds to the transport path of the liquid and the height is that dimension which causes the capillarity. The capillary has an opening that serves to take up the test liquid with a cross-sectional area of 0.1 mm.times.2 mm which corresponds to the base area of the cylindrical capillary. A vent opening is provided at the opposite end of the capillary which allows the displaced air in the capillary to escape when the test liquid is sucked in. The test liquid was in one case distilled water, aqua purificata according to DAB and in the other case human blood (containing EDTA as an anticoagulant, haematocrit 44%). The filling times for the test liquids were measured at half (7.5 mm transport path) and complete filling (15 mm transport path). The capillary was kept vertical during filling so that the test liquid had to cover the filling path of 15 mm against the force of gravity. The comparative results are shown in Table 1.

TABLE 1

| Coating | Filling time for blood[s] | | Filling time for water[s] |
|---|---|---|---|
| | after 7.5 mm | after 15 mm | after 15 mm |
| BSI | 0.5-0.6 | 2.1-2.7 | 0.6-0.9 |
| Antec | 1.4-2.3 | 4.7-8.4 | 4.0-7.0 |
| A.R. | 0.4-0.5 | 1.8-2.1 | 0.4-0.5 |
| INM | | 1.0-3.0 | |
| Alu-Ox | — | 1.2 | — |
| Alu-Ox/$H_2O$ | 0.2-0.3 | 0.7 | <0.2 |

The coating according to the invention (Alu-Ox/$H_2O$) is the one which wets most actively among all tested layers. The coating according to the invention (Alu-Ox/$H_2O$) produced by the action of water vapour after coating the metal has a considerably improved hydrophilicity compared to a surface (Alu-Ox) that was coated directly with aluminum oxide but was not oxidized by the action of water vapour. The production process according to the invention is relatively simple, can be controlled well and leads to stable coatings with high surface tensions that remain constant over time.

While exemplary embodiments incorporating the principles of the present invention have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An analytical test element, comprising:
a sample application site;
a detection site disposed downstream of the sample application site in a sample transport direction; and
at least one surface formed from at least one element or alloy that has been oxidized by boiling water or water vapor, the surface comprising an oxide of the element or alloy.

2. The test element of claim 1 wherein the element is derived from at least one element selected from the group consisting of Al, Si, Ti, V, Cr, Mn, Fe, Co, Ni, Zn, Ga, Ge, Zr, Nb, Cd, In, Sn and Sb.

3. The test element of claim 1 wherein the element is derived from at least one element selected from the group consisting of Al, Si, Ti and Zr.

4. The test element of claim 1 wherein the element is Al and the oxide is aluminum oxide.

5. The test element of claim 1 wherein the alloy contains at least two components selected from the group of elements consisting of Al, Si, Ti, V, Cr, Mn, Fe, Co, Ni, Zn, Ga, Ge, Zr, Nb, Cd, In, Sn and Sb.

6. The test element of claim 1 wherein the alloy contains at least one component selected from a first group of elements consisting of Al, Si, Ti, V, Cr, Mn, Fe, Co, Ni, Zn, Ga, Ge, Zr, Nb, Cd, In, Sn and Sb, which are alloyed with at least one element selected from a second group of elements consisting of Mg, Ca, Sr and Ba.

7. The test element of claim 6 wherein the alloy contains at least one component selected from a first group consisting of Al, Si, Ti and Zr, which is alloyed with at least one element selected from a second group consisting of Mg, Ca, Sr and Ba.

8. The test element of claim 7 wherein the alloy is composed of Al which is alloyed with at least one element selected from the group consisting of Mg, Ca, Sr and Ba.

9. The test element of claim 1 wherein the at least one surface has a thickness between 1 nm and 500 nm.

10. The test element of claim 1 wherein the surface comprises a superficial oxide layer having a thickness of between 0.1 nm and 500 nm.

11. The test element of claim 10 wherein the surface comprises a superficial oxide layer having a thickness of between 10 nm and 100 nm.

12. The test element of claim 1, further comprising a capillary between the sample application site and the detection site, the capillary comprising the at least one surface comprising the oxide of the element or alloy.

13. The test element of claim 12, wherein the oxide comprises aluminum oxide.

14. The test element of claim 12, wherein the oxide comprises a layer covering a plastic substrate.

* * * * *